(12) United States Patent
Chiu et al.

(10) Patent No.: US 8,027,144 B2
(45) Date of Patent: Sep. 27, 2011

(54) CAPACITOR STRUCTURE

(75) Inventors: Kai-Ling Chiu, Pingtung County (TW);
Victor Chiang Liang, Hsinchu (TW);
Chih-Yu Tseng, Hsinchu (TW);
Hui-Sheng Chang, Kinmen County
(TW); Chia-Te Chien, Keelung (TW);
You-Ren Liu, Kaohsiung (TW)

(73) Assignee: United Microelectronics Corp.,
Hsinchu (TW)

( * ) Notice: Subject to any disclaimer, the term of this patent is extended or adjusted under 35 U.S.C. 154(b) by 327 days.

(21) Appl. No.: 12/431,137

(22) Filed: Apr. 28, 2009

(65) Prior Publication Data

US 2010/0271750 A1    Oct. 28, 2010

(51) Int. Cl.
*H01G 4/30* (2006.01)
(52) U.S. Cl. ............. 361/301.4; 361/311; 361/313; 361/321.2; 361/306.1; 361/306.3
(58) Field of Classification Search ............ 361/301.4, 361/301.2, 311–313, 321.1, 321.2, 303–305, 361/306.1, 306.3, 308.1
See application file for complete search history.

(56) References Cited

U.S. PATENT DOCUMENTS

| | | | |
|---|---|---|---|
| 5,208,725 A * | 5/1993 | Akcasu | 361/313 |
| 5,583,359 A | 12/1996 | Ng et al. | |
| 5,978,206 A * | 11/1999 | Nishimura et al. | 361/303 |
| 6,178,083 B1 * | 1/2001 | Appeltans et al. | 361/306.1 |
| 6,297,524 B1 * | 10/2001 | Vathulya et al. | 257/303 |
| 6,410,954 B1 * | 6/2002 | Sowlati et al. | 257/306 |
| 6,822,312 B2 | 11/2004 | Sowlati et al. | |
| 7,154,734 B2 * | 12/2006 | Schultz et al. | 361/306.1 |
| 7,485,912 B2 * | 2/2009 | Wang | 257/307 |

* cited by examiner

*Primary Examiner* — Nguyen T Ha
(74) *Attorney, Agent, or Firm* — WPAT, PC; Justin King

(57) ABSTRACT

A capacitor structure is provided. The capacitor structure comprises a plurality of parallel conductive line levels and a plurality of vias. Each conductive line level comprises first conductive lines parallel to each other and second conductive lines parallel to each other. Also, the first conductive lines on different conductive line levels are aligned to each other and the second conductive lines on different conductive line levels are aligned to each other so as to form first conductive line co-planes and second conductive line co-planes. The vias are located on the conductive line co-planes and between the conductive line levels for connecting the conductive lines on the neighboring conductive line levels. The vias, on a height level of each of the conductive line co-planes, are arranged only on one of the neighboring conductive line co-planes.

15 Claims, 5 Drawing Sheets

CAPACITOR STRUCTURE

BACKGROUND OF THE INVENTION

1. Field of Invention

The present invention relates to a capacitor structure. More particularly, the present invention relates to an interdigitated multilayer capacitor structure.

2. Description of Related Art

Generally, the capacitor structure of the deep sub-micron complementary metal-oxide semiconductor comprises two parallel plate electrodes separated from each other by a dielectric layer. The plate electrodes typically are constructed by several layers of conductive material such as polysilicon or metal. In order to increase the capacitance of the capacitor structure, the extended structure or internal structure are added onto the original plate electrodes for further increasing the surface area of the plate electrodes. However, the major limitation of the parallel plate capacitor structure is that the minimum distance between the plate electrodes does not change as the size of the complementary metal-oxide semiconductor is scaled down. Therefore, even in the deep sub-micron generation of complementary metal-oxide semiconductor, the capacitance density of the plate capacitor structure is low.

Typically, the interdigitated capacitor structure is used in microwave applications. This kind of capacitor structure comprises closely arranged, interdigitated conductive structures. Therefore, the fringing capacitances and the crossover capacitances are produced between the interdigitated conductive structures to achieve high capacitance. Nevertheless, the crossover capacitances of the interdigitated capacitor structure is limited to a single conductor level. Hence, it is important to improve the capacitor structure of the deep sub-micron complementary metal-oxide semiconductor to increase the capacitance under the present specification.

SUMMARY OF THE INVENTION

Accordingly, at least one objective of the present invention is to provide a capacitor structure capable of solving the problem of decreasing of the time-dependency-dielectric-breakdown reference.

At least another objective of the present invention is to provide a capacitor structure capable of decreasing the pattern transferring deviation due to iso-dense pattern distribution during the photolithography process.

To achieve these and other advantages and in accordance with the purpose of the invention, as embodied and broadly described herein, the invention provides a capacitor structure over a substrate. The capacitor structure comprises a plurality of conductive line levels, a plurality of vias, a dielectric layer, a first conductive end and a second conductive end. The conductive line levels are parallel to each other and located over the substrate. Each conductive line level comprises a plurality of conductive lines including at least two first conductive lines parallel to each other and at least two second conductive lines parallel to each other. Also, each first conductive line is isolated from each second conductive line and the first conductive lines on the conductive line levels neighboring each other are aligned to each other. Further, the second conductive lines on the conductive line levels neighboring each other are aligned to each other. Accordingly, the conductive lines on the conductive line levels together form a plurality of conductive co-planes comprising at least two first conductive line co-planes and at least two second conductive line co-planes. The first conductive line co-planes have the first conductive lines thereon and the second conductive line co-planes have the second conductive lines thereon. Each conductive line co-plane comprises at least one of the conductive lines on each conductive line level. The vias are located on the conductive line co-planes and between the conductive line levels for connecting the conductive lines on the neighboring conductive line levels. The vias, on a height level of each of the conductive line co-planes, are arranged only on one of the neighboring conductive line co-planes. The dielectric layer is interposed between the conductive line levels. The first conductive end is electrically connected to the first lines on each of the conductive line levels. The second conductive end is electrically connected to the second lines on each of the conductive line levels.

According to one embodiment of the present invention, the vias are projected on a plane parallel to the conductive line levels to generate a plurality of first projections respectively without overlapping each other. Further, the first projections are staggeredly arranged on the plane. Alternatively, the first projections are arranged in an array on the plane. Furthermore, the vias only disposed on the first conductive line co-planes. Alternatively, the vias only disposed on the second conductive line co-planes.

According to one embodiment of the present invention, the conductive line levels includes at least five consecutively stacked conductive line levels having a first conductive line level, a second conductive line level, a third conductive line level, a fourth conductive line level and fifth conductive line level and when the first conductive line level is connected to the second conductive line level through the vias on the first conductive line co-planes, the second conductive line level is connected to the third conductive line level through the vias on the second conductive line co-planes. Also, the third conductive line level is connected to the fourth conductive line level through the vias on the first conductive line co-planes. Furthermore, the fourth conductive line level is connected to the fifth conductive line level through the vias on the first conductive line co-planes. Alternatively, the fourth conductive line level is connected to the fifth conductive line level through the vias on the second conductive line co-planes.

According to one embodiment of the present invention, the vias between three conductive line levels consecutively stacked on each other are projected on the plane parallel to the conductive line levels to generate a plurality of second projections respectively without overlapping each other. The second projections are staggeredly arranged on the plane. Alternatively, the second projections are arranged in an array on the plane.

In the present invention, since the vias are alternatively arranged on the conductive line co-planes between the neighboring conductive line levels, the pattern transferring deviation due to iso-dense pattern distribution during the photolithography process can be decreased and the accuracy of the formation of the via openings can be increased. Furthermore, in the present invention, on the same conductive line co-plane, the vias are discretely arranged between the conductive line levels so that the problem of decreasing the time-dependent-dielectric-breakdown reference due to high capacitance can be solved.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 1 a top view schematically showing a capacitor structure according to a preferred embodiment of the invention.

DESCRIPTION OF EMBODIMENTS

Figure 1:
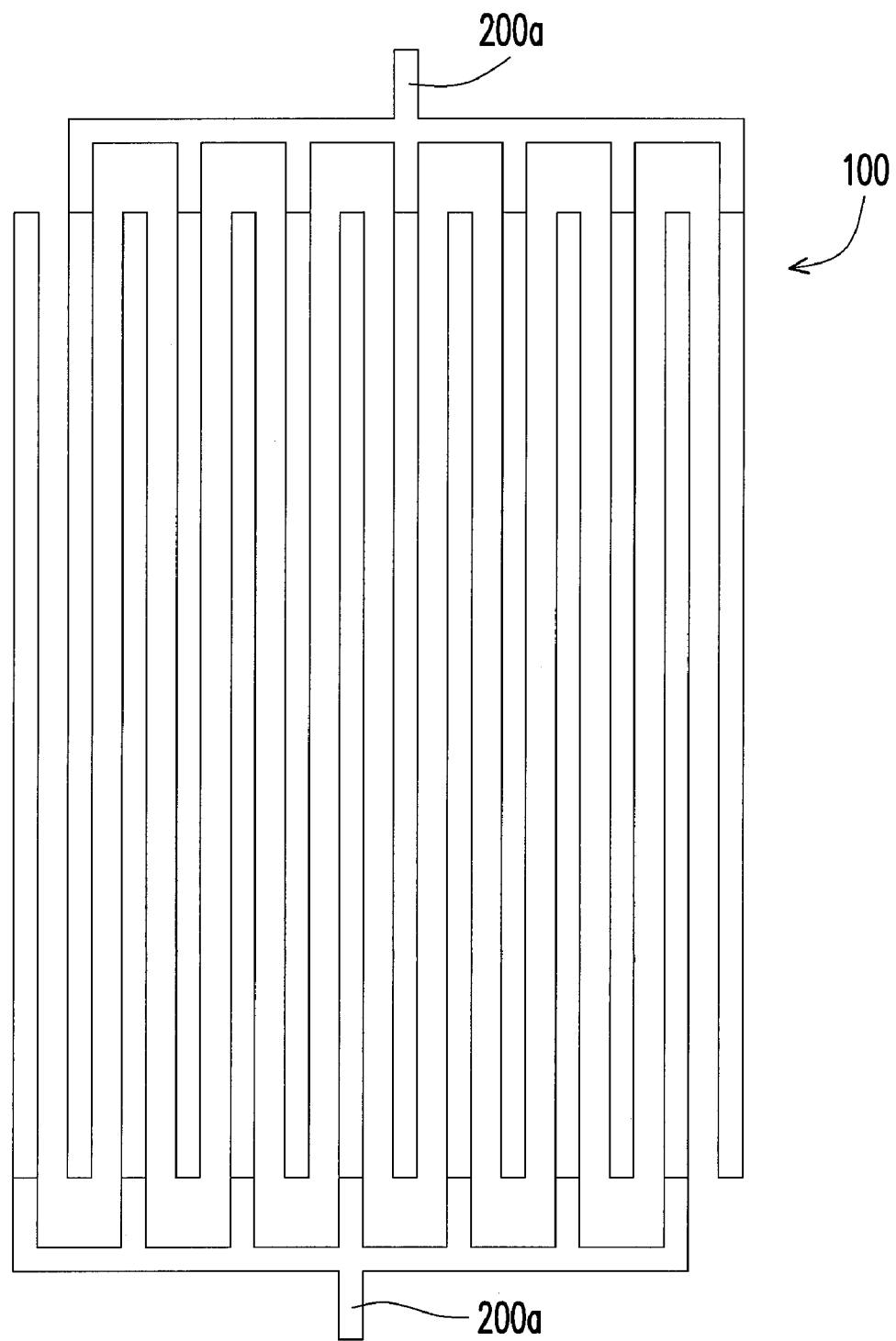
Figure 2:
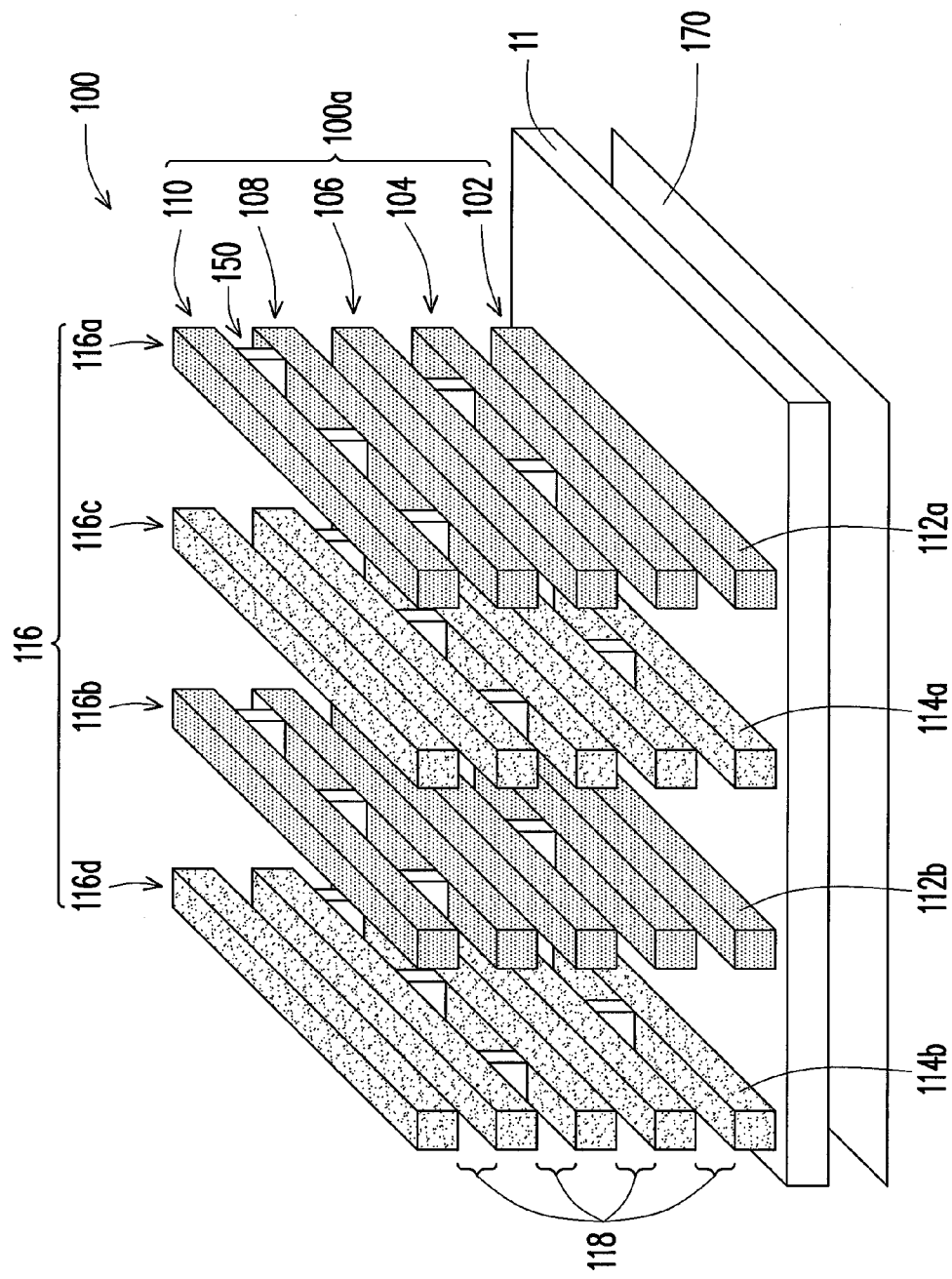
FIG. 2 is a three-dimensional perspective diagram showing the capacitor according to one embodiment of the present invention.

FIG. 1 a top view schematically showing a capacitor structure according to a preferred embodiment of the invention. The capacitor of the present invention can be, for example, an interdigitated multilayer capacitor structure 100 shown in FIG. 1. This interdigitated multilayer capacitor structure 100 can be applied in a complimentary metal-oxide semiconductor (CMOS) for generating capacitance. FIG. 2 is a three-dimensional perspective diagram showing the capacitor according to one embodiment of the present invention. As shown in FIG. 1 and FIG. 2, the capacitor structure 100 is located over a substrate 11. The capacitor structure 100 possesses several conductive line levels 100a comprising at least the conductive line levels 102, 104, 106, 108 and 110 consecutively stacked from bottom to the top. The conductive line levels 100a are parallel to each other and disposed over the substrate 11. Each of the conductive line levels has several conductive lines. For example, the conductive line level 102 comprises at least two first conductive lines 112a and 112b parallel to each other and at least two second conductive lines 114a and 114b parallel to each other.

Furthermore, the first conductive lines 112a and 112b and the second conductive lines 114a and 114b are parallel to each other and are alternatively arranged on the conductive line level 102. Moreover, the first conductive lines 112a and 112b and the second conductive lines 114a and 114b are isolated from each other. The first conductive lines 112a/112b on the neighboring conductive line levels 100a are aligned to each other and the second conductive lines 114a/114b on the neighboring conductive line levels 100a are aligned to each other. Accordingly, the first conductive lines 112a and 112b and the second conductive lines 114a and 114b on the conductive line levels 102, 104, 106, 108 and 110 form several conductive line co-planes 116 perpendicular to the substrate 11. The conductive line co-planes 116 comprises the first conductive line co-plane 116a including the first conductive lines 112a on all the conductive line levels 110a, the first conductive line co-plane 116b including the first conductive lines 112b on all the conductive line levels 110a, the second conductive line co-plane 116c including the second conductive lines 114a on all the conductive line levels 110a and the second conductive line co-plane 116d including the second conductive lines 114b on all the conductive line levels 110a. Furthermore, each of the conductive line co-planes 116 comprises at least one of the conductive lines 112a, 112b, 114a and 114b of each of the conductive line levels 100a.

Moreover, as mentioned above that the first conductive lines 112a and 112b and the second conductive lines 114a and 114b are isolated from each other, the first conductive line co-planes 116a and 116b and the second conductive line co-planes 116c and 116d are isolated from each other. Further, there is a dielectric layer 118 is interposed between the conductive line levels 100a.

Also, the capacitor structure 100 of the present invention comprises several vias 150 disposed between the conductive line levels 100a for further connecting the conductive lines on the neighboring conductive line levels 100a. On the other words, the vias 150 disposed between the conductive line levels 100a and on the conductive line co-planes 116 respectively are used to connect the aligned first conductive lines in the neighboring conductive line levels 100a and to connect the aligned second conductive lines in the neighboring conductive line levels 100a. As shown in FIG. 2, at the same height level, the vias 150 are not arranged on both of the directly neighboring conductive line co-planes. Taking the via arrangement on the first conductive line co-plane 116a and the second conductive line co-plane 116c, which are directly adjacent to each other, as an example, at a height level of the conductive line co-planes 116, the vias 150 are arranged only on one of the first conductive line co-plane 116a and the second conductive line co-plane 116c.

Figure 3A:
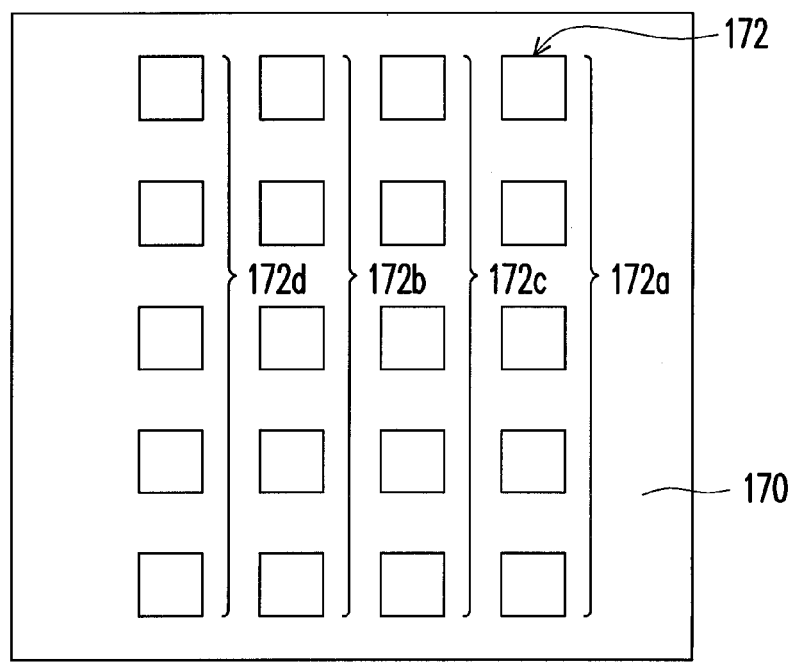
FIG. 3A is a schematic diagram showing the projections of vias on a plane parallel to the conductive line level.
Figure 3B:
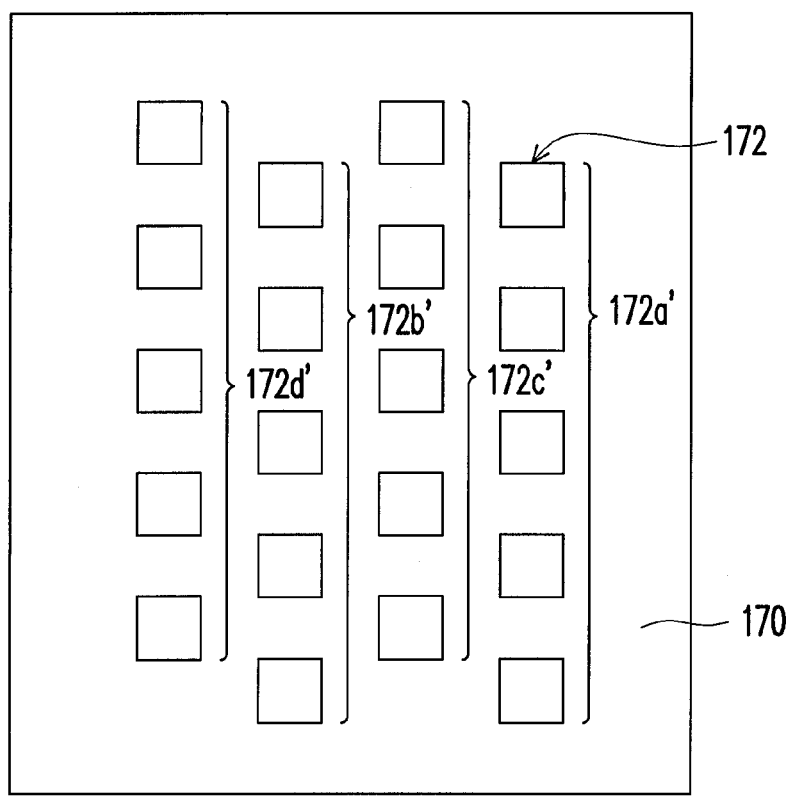
FIG. 3B is a schematic diagram showing the projections of vias on a plane parallel to the conductive line level.

FIG. 3A and FIG. 3B are a schematic diagrams respectively showing the projections of vias on a plane parallel to the conductive line level. As shown in FIG. 2, FIG. 3A and FIG. 3B, the vias 150 between the conductive line levels 100a are projected onto a plane 170 parallel to the conductive line levels 100a to generate several projections 172 respectively. The projections 172 are arranged without being overlapped to each other. The projections 172 are arranged to be an array (as shown in FIG. 3A) or or a staggered form (as shown in FIG. 3B). That is, when the arrangement of the vias 150 on each conductive line co-plane is as same as the arrangement shown in FIG. 2, the vias, which are located on the same conductive line co-plane, are not aligned to each other in a direction vertical to the plane 170. Accordingly, the projections 172 of the vias 150 on the plane 170 are arranged without overlapping each other and the arrangement of the projections can be the array arrangement as shown in FIG. 3A or the staggered arrangement as shown in FIG. 3B. As shown in FIG. 3A, the projections of the vias, which are located on the first conductive line co-planes 116a and 116b, projecting onto the plane 170 are labeled 172a and 172b respectively. Also, the projections of the vias, which are located on the second conductive line co-planes 116c and 116d, projecting onto the plane 170 are labeled 172c and 172d respectively. It should be noticed that the projections 172a, 172b, 172c and 172d are arranged to be an array on the plane 170 and do not overlap each other. Furthermore, as shown in FIG. 3B, the projections of the vias, which are located on the first conductive line co-planes 116a and 116b, projecting onto the plane 170 are labeled 172a' and 172b' respectively. Also, the projections of the vias, which are located on the second conductive line co-planes 116c and 116d, projecting onto the plane 170 are labeled 172c' and 172d' respectively. It should be noticed that the projections 172a', 172b', 172c' and 172d' are arranged to be a staggered arrangement on the plane 170 and do not overlap each other.

In one embodiment, for three consecutive stacked conductive line levels, such as the conductive line levels 102, 104 and 106, the projections 172 of the vias 150 between the conductive line levels 102, 104 and 106 are disposed on the plane 170 without overlapping each other. That is, the vias 150, which are located between the three consecutive stacked conductive line levels 100a and on the same conductive line co-plane 116, are staggeredly arranged on the conductive line co-plane 116 but not aligned to each other in a direction vertical to the plane 170. Because of the arrangement of the vias 150 mentioned above, the problem of decreasing of the time-dependent-dielectric-breakdown reference due to high capacitance can be overcome.

Furthermore, between the neighboring conductive line levels 100a, when the vias 150 are arranged on the first conductive line co-planes 116a and 116b, there is no vias 150 arranged on the second conductive line co-planes 116c and 116d. That is, for the same height level, the vias 150 are not arranged on both of the neighboring conductive line co-planes 116. One the other words, vias 150 are arranged on either the first conductive line co-planes 116a and 116b or the second conductive line co-planes 116c and 116d. Accordingly, the pattern transferring deviation due to iso-dense pattern distribution during the photolithography process can be decreased. Thus, the accuracy of the formation of the via opening can be increased.

Figure 4:
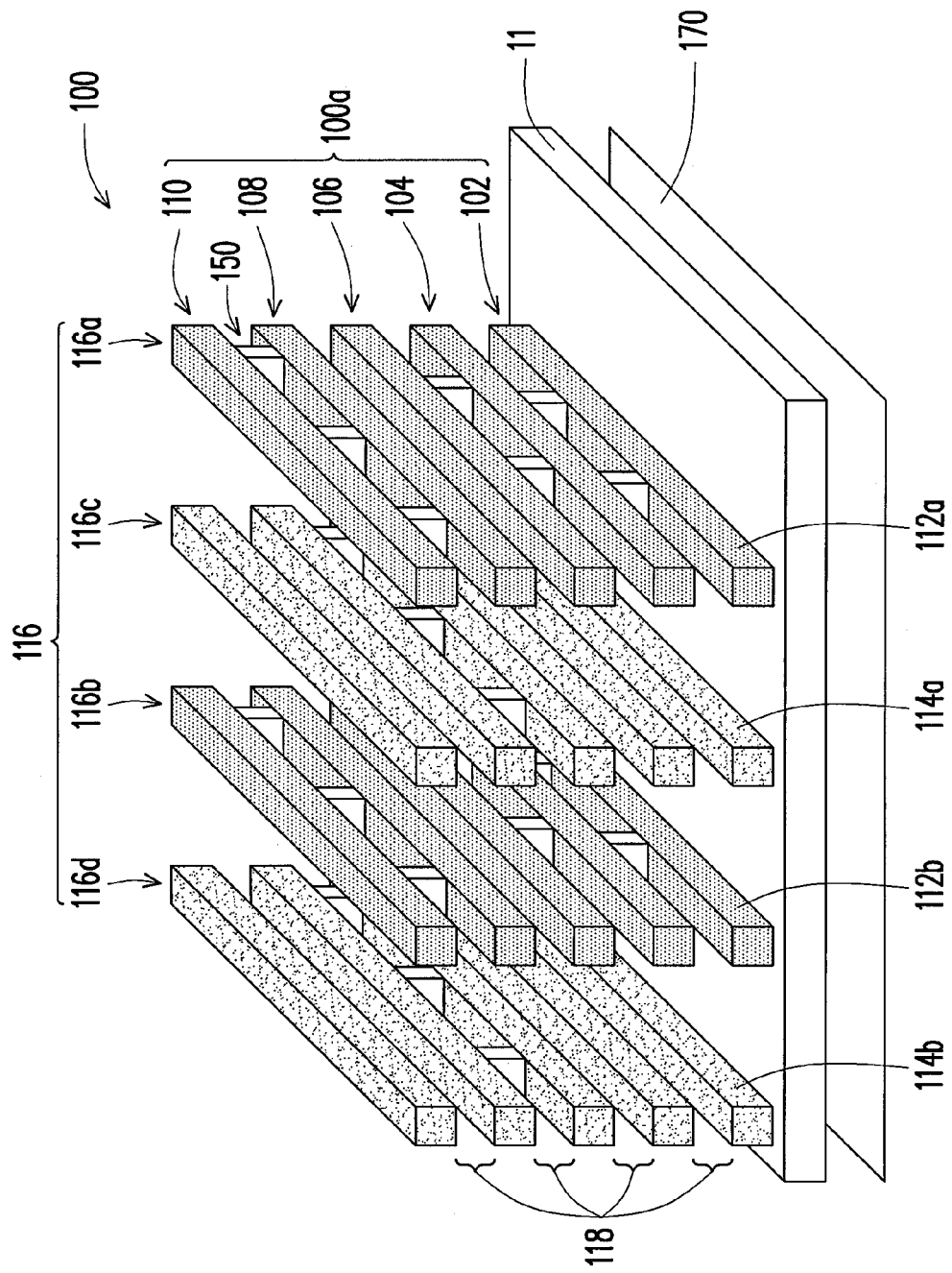
FIG. 4 is a three-dimensional perspective diagram showing the capacitor according to another embodiment of the present invention.

In one embodiment, as shown in FIG. 2, among five conductive line levels 100a consecutively stacked on each other, when the conductive line level 110 is connected to the conductive line level 108 through the vias 150 on the first conductive line co-planes 116a and 116b, the conductive line level 108 is connected to the conductive line level 106 through the vias 150 on the second conductive line co-planes 116c and 116d. Also, the conductive line level 106 is connected to the conductive line level 104 through the vias 150 on the first conductive line co-planes 116a and 116b. Further, the conductive line level 104 is connected to the conductive line level 102 through the vias 150 on the second conductive line co-planes 116c and 116d. That is, the vias are arranged on the conductive line co-planes, which are directly adjacent to each other, in a regular alternative arrangement to connect the conductive line levels to each other. Therefore, the aforementioned arrangement of the vias complies with the arrangement principle of the vias, in which the vias at the same height level are arranged only on one of the directly adjacent conductive line co-planes. In another embodiment shown in FIG. 4, among five conductive line levels 100a consecutively stacked on each other, the arrangement of the vias 150 between the conductive line levels 104, 106, 108 and 110 are as same as the arrangement mentioned above. However, the conductive line level 104 is connected to the conductive line level 102 through the vias 150 on the first conductive line co-planes 116a and 116b. That is, the vias are arranged on the conductive line co-planes, which are directly adjacent to each other, in an irregular staggered arrangement to connect the conductive line levels to each other. Therefore, the aforementioned arrangement of the vias complies with the arrangement principle of the vias, in which the vias, at the same height level, are arranged only on one of the directly adjacent conductive line co-planes.

Figure 5:
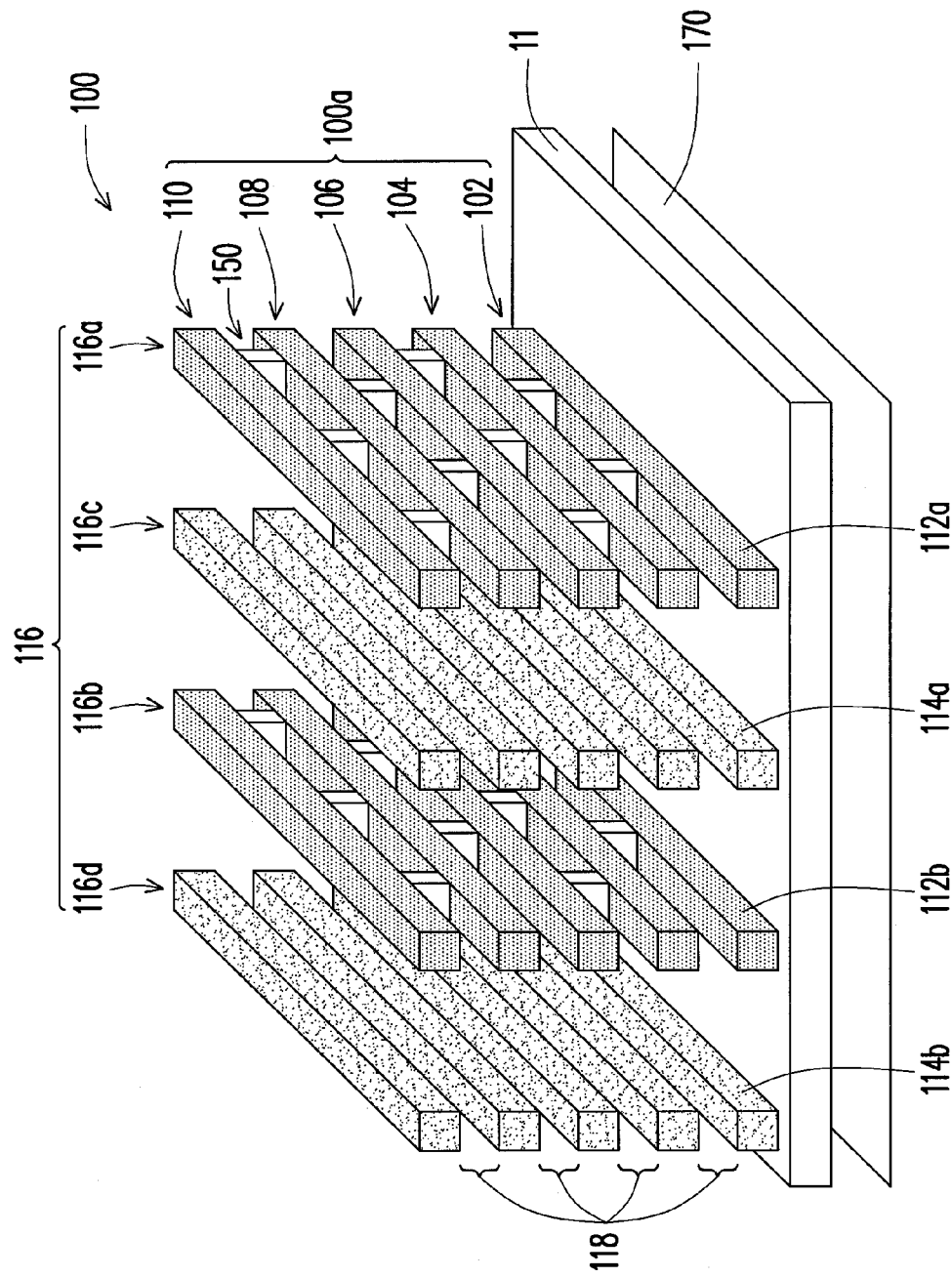
FIG. 5 is a three-dimensional perspective diagram showing the capacitor according to the other embodiment of the present invention.

FIG. 5 is a three-dimensional perspective diagram showing the capacitor according to the other embodiment of the present invention. In the other embodiment, as shown in FIG. 5, all of the vias 150 can be arranged only on either the first conductive line levels 116a and 116b (as shown in FIG. 5) or the second conductive line levels 116c and 116d.

Furthermore, the capacitor structure 100, as shown in FIG. 1, comprises a first conductive end 200a and a second conductive end 200b. The first conductive end 200a electrically to connected all the first conductive lines 112a and 112b on each of the conductive line levels 100a so that the first conductive lines 112a and 112b together form a first electrode. Also, the second conductive end 200b electrically connected to all the second conductive lines 114a and 114b on each of the conductive line levels 100a so that the second conductive lines 114a and 114b together form a second electrode. The first conductive lines 112a and 112b and the second conductive lines 114a and 114b in the aforementioned first electrode and the aforementioned second electrode are arranged to be in a form of interdigitated type so as to form an interdigitated multilayer capacitor structure.

Altogether, in the present invention, since the vias are alternatively arranged on the conductive line co-planes between the neighboring conductive line levels, the pattern transferring deviation due to iso-dense pattern distribution during the photolithography process can be decreased and the accuracy of the formation of the via openings can be increased. Furthermore, in the present invention, on the same conductive line co-plane, the vias are alternatively arranged between the conductive line levels or discretely arranged between the conductive line levels so that the problem of decreasing the time-dependent-dielectric-breakdown reference due to high capacitance can be solved.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A capacitor structure over a substrate, comprising:
a plurality of conductive line levels parallel to each other and located over the substrate, wherein each conductive line level comprises a plurality of conductive lines including at least two first conductive lines parallel to each other and at least two second conductive lines parallel to each other, each first conductive line is isolated from each second conductive line, the first conductive lines on the conductive line levels neighboring each other are aligned to each other and the second conductive lines on the conductive line levels neighboring each other are aligned to each other so that the conductive lines on the conductive line levels together form a plurality of conductive co-planes comprising at least two first conductive line co-planes having the first conductive lines thereon and at least two second conductive line co-planes having the second conductive lines thereon, each conductive line co-plane comprises at least one of the conductive lines on each conductive line level;
a plurality of vias located on the conductive line co-planes and between the conductive line levels for connecting the conductive lines on the neighboring conductive line levels, wherein, on a height level of each of the conductive line co-planes, the vias are arranged only on one of the neighboring conductive line co-planes;
a dielectric layer interposed between the conductive line levels;
a first conductive end electrically connected to the first lines on each of the conductive line levels; and
a second conductive end electrically connected to the second lines on each of the conductive line levels.

2. The capacitor structure of claim 1, wherein the vias are projected on a plane parallel to the conductive line levels to generate a plurality of first projections respectively.

3. The capacitor structure of claim 2, wherein the first projections are staggeredly arranged on the plane.

4. The capacitor structure of claim 2, wherein the first projections are arranged in an array on the plane.

5. The capacitor structure of claim 2, wherein the vias only disposed on the first conductive line co-planes.

6. The capacitor structure of claim 2, wherein the vias only disposed on the second conductive line co-planes.

7. The capacitor structure of claim 1, wherein the vias only disposed on the first conductive line co-planes.

8. The capacitor structure of claim 1, wherein the vias only disposed on the second conductive line co-planes.

9. The capacitor structure of claim 1, wherein the conductive line levels includes at least five consecutively stacked conductive line levels having a first conductive line level, a second conductive line level, a third conductive line level, a fourth conductive line level and fifth conductive line level and when the first conductive line level is connected to the second conductive line level through the vias on the first conductive line co-planes, the second conductive line level is connected to the third conductive line level through the vias on the second conductive line co-planes.

10. The capacitor structure of claim 9, wherein the third conductive line level is connected to the fourth conductive line level through the vias on the first conductive line co-planes.

11. The capacitor structure of claim 10, wherein the fourth conductive line level is connected to the fifth conductive line level through the vias on the first conductive line co-planes.

12. The capacitor structure of claim 10, wherein the fourth conductive line level is connected to the fifth conductive line level through the vias on the second conductive line co-planes.

13. The capacitor structure of claim 1, wherein the vias between three conductive line levels consecutively stacked on each other are projected on the plane parallel to the conductive line levels to generate a plurality of second projections respectively without overlapping each other.

14. The capacitor structure of claim 13, wherein the second projections are staggeredly arranged on the plane.

15. The capacitor structure of claim 13, wherein the second projections are arranged in an array on the plane.

* * * * *